(12) United States Patent  (10) Patent No.: US 7,732,917 B2
Saito et al.  (45) Date of Patent: Jun. 8, 2010

(54) POWER MODULE

(75) Inventors: Masao Saito, Kyoto (JP); Takukazu Otsuka, Kyoto (JP); Keiji Okumura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 12/243,098

(22) Filed: Oct. 1, 2008

(65) Prior Publication Data

US 2009/0095979 A1 Apr. 16, 2009

(30) Foreign Application Priority Data

Oct. 2, 2007 (JP) ............................ 2007-258745
Sep. 29, 2008 (JP) ............................ 2008-250388

(51) Int. Cl.
*H01L 21/34* (2006.01)

(52) U.S. Cl. ............... 257/712; 257/717; 257/E23.08; 257/E29.197

(58) Field of Classification Search ................. 257/712, 257/177, E23.08, E29.197, 717
See application file for complete search history.

(56) References Cited

U.S. PATENT DOCUMENTS 7,557,442 B2 * 7/2009 Licht .......................... 257/720

FOREIGN PATENT DOCUMENTS

JP 2005-142228 6/2005

* cited by examiner

*Primary Examiner*—Roy K Potter
(74) *Attorney, Agent, or Firm*—Fish & Richardson P.C.

(57) ABSTRACT

A power module includes a substrate having first and second main substrate surfaces; a semiconductor device disposed on the first main substrate surface, and having a first main surface on which a first main electrode is formed, and a second main surface on which a second main electrode in contact with the first main substrate surface is formed; a heat conduction portion disposed on the first main substrate surface in a residual region of a region on which the semiconductor device is disposed; and an upper cooling portion disposed on the heat conduction portion.

29 Claims, 4 Drawing Sheets

US 7,732,917 B2

POWER MODULE

CROSS REFERENCE TO RELATED APPLICATIONS AND INCORPORATION BY REFERENCE

This application is based upon and claims the benefit of priority from prior Japanese Patent Application P2007-258745 filed on Oct. 2, 2007 and prior Japanese Patent Application P2008-250388 filed on Sep. 29, 2008; the entire contents of which are incorporated by reference herein.

BACKGROUND OF THE INVENTION

1. Field of the Invention

The present invention relates to a power module that converts a direct current into an alternating current, and particularly to a power module in which a semiconductor device is mounted on a substrate.

2. Description of the Related Art

A power module switches a switching device such as an insulating gate bipolar transistor (IGBT), thereby converts a direct current supplied from a direct current power supply into an alternating current, and drives an alternating-current motor or the like by the alternating current. In particular, a power module with which a control circuit for the switching device is integrated is referred to as an intelligent power module (IPM). A heating value of the IGBT or the like is large, and accordingly, in the power module, heat radiation from the device becomes a problem. Therefore, there are taken measures for cooling the power module, for example, disposition of a cooling mechanism such as a heat radiation plate that radiates heat generated by the switching device.

However, a surface of the device that composes the power module is thermally insulated by gel or the like, and accordingly, the heat generated by the device is radiated from only a back surface of the device, which is in contact with the substrate. Therefore, cooling efficiency has been low, and it has been necessary to radiate the heat by disposing a large cooling mechanism on the substrate. As a result, it has been difficult to miniaturize the power module.

SUMMARY OF THE INVENTION

An aspect of the present invention is a power module including a substrate having a first main substrate surface and a second main substrate surface opposite with the first main substrate surface; a semiconductor device disposed on the first main substrate surface, and having a first main surface on which a first main electrode is formed, and a second main surface on which a second main electrode in contact with the first main substrate surface is formed, the second main surface being opposite with the first main surface; a heat conduction portion disposed on the first main substrate surface in a residual region of a region on which the semiconductor device is disposed; and an upper cooling portion disposed on the heat conduction portion.

DETAILED DESCRIPTION OF THE INVENTION

Figure 1:
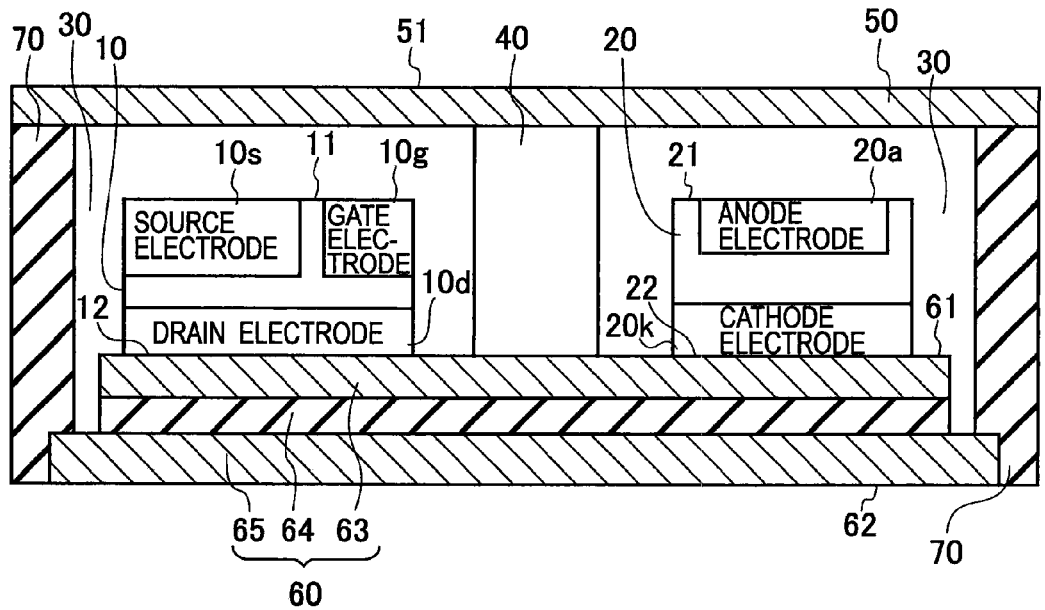
FIG. 1 is a schematic side view of a power module according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of semiconductor devices, it will be appreciated that the various drawings are not drawn to scale from one figure to another nor inside a given figure.

In the following descriptions, numerous specific details are set forth such as specific signal values, etc., to provide a thorough understanding of the present invention. However, it will be obvious to those skilled in the art that the present invention may be practiced without such specific details.

First Embodiment

As shown in FIG. 1, a power module according to a first embodiment of the present invention includes: a substrate 60 having a first main substrate surface 61 and a second main substrate surface 62 opposite with the first main substrate surface 61; a switching device 10 and a commutation diode 20, which are arranged on the first main substrate surface 61; a heat conduction portion 40 disposed on the first main substrate surface 61 in a residual region of regions on which the switching deice 10 and the commutation diode 20 are arranged; and an upper cooling portion 50 disposed on the heat conduction portion 40.

The switching device 10 has a first main surface 11 on which a first main electrode (source electrode 10s) is formed, and a second main surface 12 on which a second main electrode (drain electrode 10d) in contact with the first main substrate surface 61 is formed, the second main surface 12 being opposite with the first main surface 11. The commutation diode 20 has a first main surface 21 on which a first main electrode (anode electrode 20a) is formed, and a second main surface 22 on which a second main electrode (cathode electrode 20k) in contact with the first main substrate surface 61 is formed, the second main surface 22 being opposite with the first main surface 21.

The substrate 60 has a structure in which a metal pattern layer 63, an insulating layer 64 and a heat spreader 65 are stacked on one another. In the example shown in FIG. 1, a surface of the metal pattern layer 63, which is opposite with a surface thereof in contact with the insulating layer 64, is the first main substrate surface 61. A surface of the heat spreader 65, which is opposite with a surface thereof in contact with the insulating layer 64, is the second main substrate surface 62.

Figure 2:
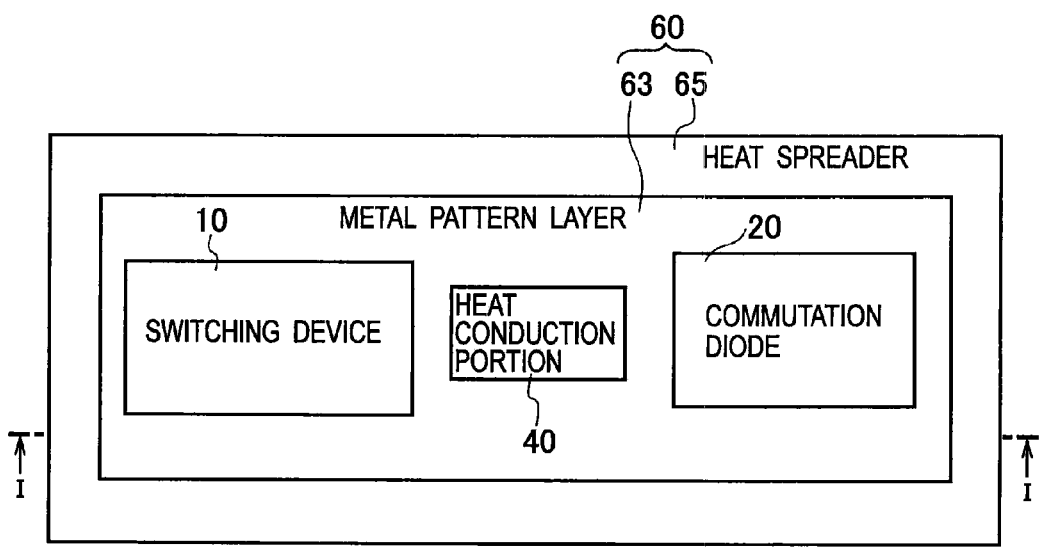
FIG. 2 is a schematic plan view of the power module according to the first embodiment of the present invention.

FIG. 2 shows a plan view of the power module shown in FIG. 1. FIG. 1 is a cross-sectional view taken along a I-I direction of FIG. 2. While seeing through the upper cooling portion 50, FIG. 2 shows the substrate 60, the switching device 10 and the commutation diode 20, and the heat conduction portion 40. In FIG. 2, a case 70 and respective electrodes of the switching device 10 and the commutation diode 20 are not shown.

On the metal pattern layer 63 of the substrate 60, a circuit pattern for realizing a desired circuit using the switching device 10 and the commutation diode 20 is formed by using a metal film. An aluminum (Al) film, a copper (Cu) film and the like are employable as the metal film for use in the metal pattern layer 63. For the insulating layer 64, there are employable alumina ($Al_2O_3$), aluminum nitride (AlN), silicon nitride (SiN), silicon oxide ($SiO_2$) and the like. For the heat spreader 65, a highly thermal conductive material, for example, a material in which thermal conductivity is approximately 200 W/mK or more is employable. Specifically, Al in which the thermal conductivity is approximately 240 W/mK, Cu in which the thermal conductivity is approximately 370 W/mK, and the like are usable. In other words, as the substrate 60, there is employable a thermal-conductive insulating substrate such as a direct brazed aluminum (DBA) substrate that employs Al for the metal film of the metal pattern layer 63, and a direct bonding copper (DBC) substrate that employs Cu for the metal film of the metal pattern layer 63.

FIG. 1 shows an example where the switching device 10 is an npn-type IGBT, in which the source electrode 10s and a gate electrode 10g are formed on the first main surface 11, and the drain electrode 10d is formed on the second main surface 12. Besides the IGBT, as the switching device 10, there is employable a device capable of controlling, by a control electrode, a main current flowing between the first main electrode disposed on the first main surface 11 and the second main electrode disposed on the second main surface 12, for example, a MOS field effect transistor (FET) or the like.

As a material of the switching device 10 and the commutation diode 20, silicon (Si), silicon carbide (SiC), gallium nitride (GaN), AlN, diamond and the like are employable. In order to suppress a switching loss and a power loss, SiC and GaN are preferable. Moreover, the power module is operable up to approximately 300° C. in the case of employing SiC and GaN, and accordingly, SiC and GaN are preferable in such a case where a substrate temperature rises to approximately 200° C. in order to increase an output of the power module concerned. Moreover, it becomes possible to drive the power module at a high frequency by employing GaN.

In the case where a substrate containing AlN, such as a DBA substrate having a stack structure of Al/AlN/Al, is employed as the substrate 60, thermal expansion coefficients of the device and the substrate become equivalent to each other by employing AlN for the device disposed on the substrate 60, and a problem of a device breakdown owing to an occurrence of a thermal stress can also be avoided. Moreover, a breakdown coefficient of AlN is larger than those of SiC and GaN, and accordingly, AlN is employed for the device disposed on the substrate 60, whereby a withstand voltage of the device can be enhanced. The diamond is superior to all of the above-described materials in terms of physical values. Therefore, the diamond is employed as the material of the switching device 10 and the commutation diode 20, whereby miniaturization of the power module is realized, and the power loss and the switching loss are reduced to a large extent.

The respective electrodes of the switching device 10 and the commutation diode 20 are electrically connected to a metal pattern formed on the metal pattern layer 63 directly or through bonding wires, and compose the power module. Specifically, the drain electrode 10d of the switching device 10 and the cathode electrode 20k of the commutation diode 20 are directly connected to the metal pattern layer 63 by soldering and the like. The source electrode 10s and gate electrode 10g of the switching device 10 and the anode electrode 20a of the commutation diode 20 are connected to the metal pattern layer 63 by the bonding wires (not shown). Alternatively, by the bonding wires and the like, the respective electrodes of the switching device 10 and the commutation diode 20 are connected to a wiring pattern in the case 70 in which the power module is housed. The case 70 is formed, for example, of synthetic resin and the like.

In order to efficiently radiate heat generated in the switching device 10 and the commutation diode 20, it is preferable to dispose the heat conduction portion 40 as close as possible to the switching device 10 and the commutation diode 20. Moreover, though FIG. 1 and FIG. 2 show an example where a single heat conduction portion 40 is disposed on the first main substrate surface 61, a plurality of the heat conduction portions 40 may be disposed thereon. For example, one heat conduction portion 40 may be disposed on the same region as that of a metal pattern to which the drain electrode 10d is connected, and the other heat conduction portion 40 may be disposed on the same region as that of a metal pattern to which the cathode electrode 20k is connected. In this case, for the heat conduction portions 40, an insulating material that is highly thermal conductive, for example, an epoxy adhesive and the like are employable. Specifically, for the heat conduction portion 40, there are employable an epoxy adhesive (grease) in which insulating ceramics are contained as a main component, a maximum operating temperature is approximately 260° C. and thermal conductivity is approximately 4 to 5 W/mK, and the like.

Alternatively, only an end portion of the heat conduction portion 40, which is brought into contact with the metal pattern of the metal pattern layer 63, may be formed of an insulating material, and other portions may be formed of a conductive material such as Al and Cu. Moreover, in the case of disposing the heat conduction portion 40 on a region of the metal pattern layer 63, on which the metal pattern does not exist, the conductive material is employable for the heat conduction portion 40. The heat conduction portion 40 made of the conductive material is connected to the metal pattern layer 63, for example, by using solder and the like.

It is more preferable that the heat conduction portion 40 has anisotropic thermal conductive properties. Specifically, in terms of the heat radiation from the switching device 10 and the commutation diode 20, it is preferable that thermal conductivity in a normal line direction of the first main substrate surface 61 (hereinafter, simply referred to as a "normal line direction") be larger than thermal conductivities in other directions thereof differing from the normal line direction. In other words, the heat transmitted from the second main surface 12 of the switching device 10 and the second main surface 22 of the commutation diode 20 through the substrate 60 to the heat conduction portion 40 mainly propagates through the heat conduction portion 40 in the normal line direction. The heat that has propagated through the heat conduction portion 40 is transmitted to the upper cooling portion 50. As a result, the heat generated in the switching device 10 and the commutation diode 20 is efficiently propagated to the upper cooling portion 50.

The material having the anisotropic thermal conductive properties is, for example, a composite material (for example, Al/CF, Al/CF/VGCF or the like) formed by complexing carbon fiber (CF) or special carbon fiber (vapor grown carbon fiber (VGCF)), which has high thermal conductivity, with highly thermal conductive metal (for example, Al or the like). In such a composite material, thermal conductivity thereof in a fiber direction of the carbon fiber is approximately 700

W/mK, whereas thermal conductivity thereof in other directions is approximately 20 to 50 W/mK.

In a similar way to the heat spreader 65, for the upper cooling portion 50, a highly thermal conductive material, for example, a material with thermal conductivity of approximately 200 W/mK or more is employable. Specifically, a metal plate of Al, Cu or the like is usable as the upper cooling portion 50.

In a state where the devices (switching device 10 and commutation diode 20) and the heat conduction portion 40, which are included in the power module shown in FIG. 1, are mounted on the substrate 60, the substrate 60 is packaged in the case 70. At this time, the substrate 60 is packaged in the case 70 so that a back surface (second main substrate surface 62) of the heat spreader 65, which is opposite with the surface thereof in contact with the insulating layer 64, is exposed to an outside. Then, wire bonding, which is necessary to connect the wiring pattern (not shown) of the case 70 and the devices to each other, and so on, is performed for the power module, and the power module is thereafter sealed by a sealing film 30.

In order to protect the devices, which are mounted on the power module, from breakage owing to a physical impact and an electric discharge in the ambient air, the sealing film 30 is formed so as to cover peripheries of the switching device 10 and the commutation diode 20. For the sealing film 30, for example, a gel-like material made of silicon resin or epoxy resin, and the like are employable.

The sealing film 30 is formed so that an upper surface of the heat conduction portion 40 is exposed from the sealing film 30 concerned. The upper cooling portion 50 is disposed so as to contact the exposed upper surface of the heat conduction portion 40. As a result, the heat generated in the switching device 10 and the commutation diode 20 is transmitted to the upper cooling portion 50 through the substrate 60 and the heat conduction portion 40. The way of radiating the heat from the upper cooling portion 50 may be natural cooling. Alternatively, the upper cooling portion 50 may be forcibly cooled by air cooling using a fan or liquid cooling in such a manner that a cooling apparatus is attached to the case 70 on which the power module is mounted.

Figure 3:
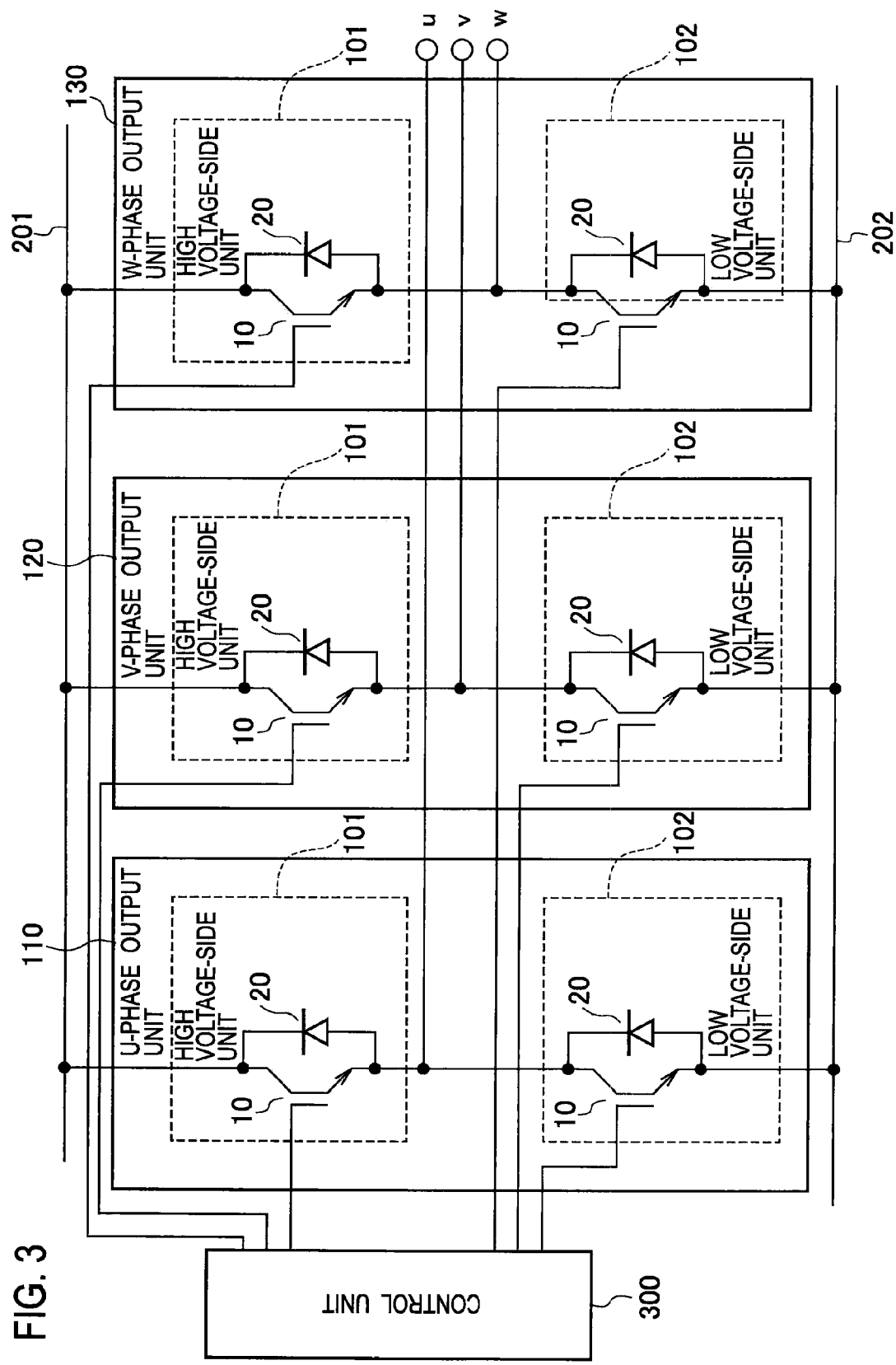
FIG. 3 is a circuit diagram showing an example of a circuit configuration using the power module according to the first embodiment of the present invention.

A circuit example using the power module shown in FIG. 1 is shown in FIG. 3. The circuit shown in FIG. 3 is a power conversion circuit composed of a three-phase pulse width modulation (PWM) inverter. This power conversion circuit includes a P-power line 201 as a high-voltage direct-current power line and an N-power line 202 as a low-voltage direct-current power line. The power conversion circuit further includes a U-phase output unit 110, a V-phase output unit 120 and a W-phase output unit 130, which are individually disposed between the P-power line 201 and the N-power line 202. Each of the U-phase output unit 110, the V-phase output unit 120 and the W-phase output unit 130 has a high voltage-side unit 101 and a low voltage-side unit 102.

Configurations of the high voltage-side unit 101 and the low voltage-side unit 102 are the same, and each of the configurations is one in which the switching device 10 and the commutation diode 20, which are shown in FIG. 1, are connected to each other in parallel. The drain electrode 10*d* of the switching device 10 included in the high voltage-side unit 101 and the cathode electrode 20*k* of the commutation diode 20 included therein are connected to the P-power line 201. The source electrode 10*s* of the switching device 10 included in the high-voltage side unit 101 and the anode electrode 20*a* of the commutation diode 20 included therein are connected to a connecting point of the drain electrode 10*d* of the switching device 10 included in the low voltage-side unit 102 and the cathode electrode 20*k* of the commutation diode 20 included therein. The source electrode 10*s* of the switching device 10 included in the low voltage-side unit 102 and the anode electrode 20*a* of the commutation diode 20 included therein are connected to the N-power line 202.

The gate electrodes 10 *g* of the switching devices 10 included in the high voltage-side unit 101 and the low voltage-side unit 102 are connected to a control circuit (gate drive circuit) 300. Operations (ON/OFF) of the switching devices 10 are controlled by the control circuit 300, and direct currents supplied from the P-power line 201 and the N-power line 202 are converted into alternating currents.

The respective electrodes of the switching devices 10 and the commutation diodes 20 are electrically connected, directly or through the bonding wires, to the metal patterns formed on the metal pattern layers 63 or to the wiring patterns in the cases 70 in which the power modules are housed, and compose the power modules shown in FIG. 3. Note that, as shown in FIG. 3, a U-phase alternating current output u, a V-phase alternating current output v and a W-phase alternating current output w are outputted from the respective connecting points of the high voltage-side units 101 and the low voltage-side units 102 in the U-phase output unit 110, the V-phase output unit 120 and the W-phase output unit 130, respectively. Alternating currents different in phase are flown to three phases (coils) of a motor, which are, for example, a U phase, a V phase and a W phase, by the U-phase alternating current output u, the V-phase alternating current output v and the W-phase alternating current output w, whereby the motor rotates.

In the power module shown in FIG. 1, at the same time when the heat generated in the switching device 10 and the commutation diode 20 is radiated from the heat spreader 65, the heat concerned propagates through the substrate 60, the heat conduction portion 40 and the upper cooling portion 50, and is then radiated from the upper cooling portion 50 to the outside of the power module. In other words, in the power module shown in FIG. 1, the heat is radiated from both surfaces thereof, which are the front surface (upper surface 51 of the upper cooling portion 50) and the back surface (second main substrate surface 62). Therefore, the heat can be radiated more efficiently than in the case of radiating the heat only from the back surface of the substrate 60. As a result, for example, such a problem that a crack occurs in the sealing film 30 owing to the heat can be avoided.

As described above, in the power module according to the first embodiment of the present invention, the heat can be radiated from both of the upper and lower surfaces thereof, and accordingly, a cooling capability is enhanced. As a result, in accordance with the power module shown in FIG. 1, a large cooling mechanism is not required, and a power module capable of the miniaturization can be provided.

Second Embodiment

Figure 4:
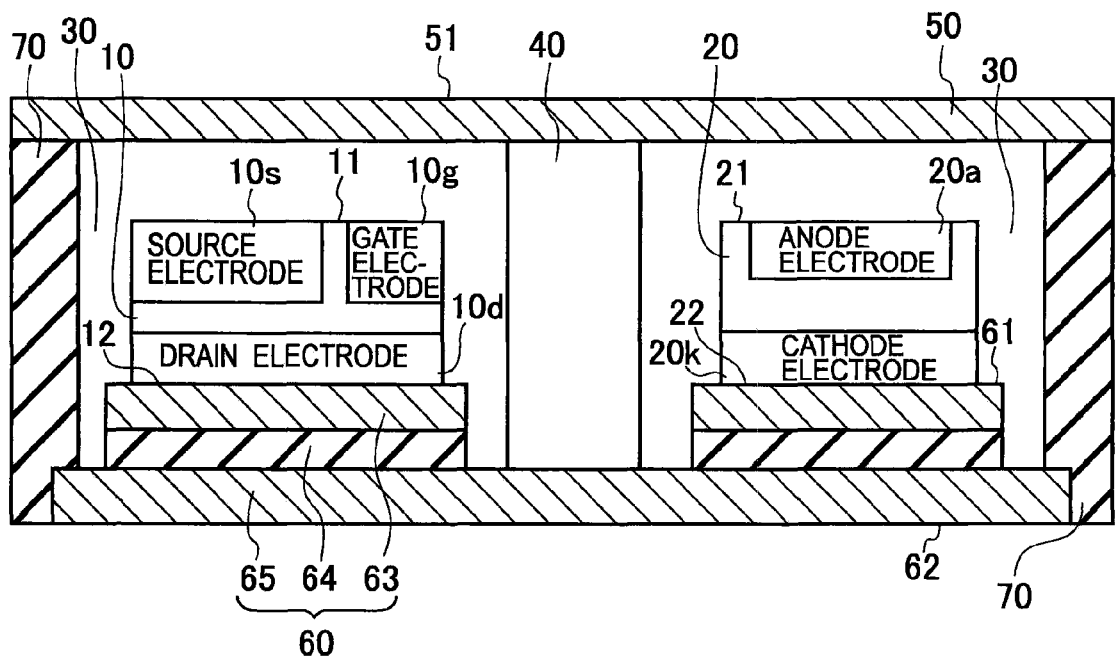
FIG. 4 is a schematic side view of a power module according to a second embodiment of the present invention.
Figure 5:
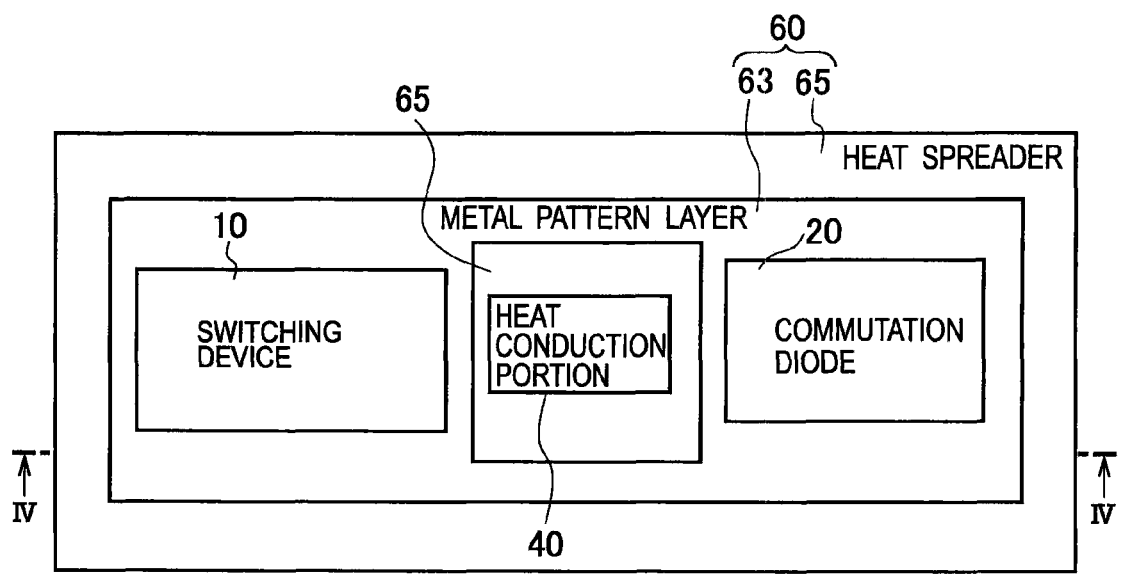
FIG. 5 is a schematic plan view of the power module according to the second embodiment of the present invention.

A power module according to a second embodiment of the present invention is different from the power module shown in FIG. 1 in that the heat conduction portion 40 is in contact with the heat spreader 65 of the substrate 60 as shown in FIG. 4. FIG. 5 shows a plan view of the power module shown in FIG. 4. FIG. 4 is a cross-sectional view taken along a II-II direction of FIG. 5. While seeing through the upper cooling portion 50, FIG. 5 shows the substrate 60, the switching device 10 and the commutation diode 20, and the heat conduction portion 40. In FIG. 5, the case 70 and the respective electrodes of the switching device 10 and the commutation diode 20 are not shown.

As shown in FIG. 4 and FIG. 5, an opening portion is provided in the metal pattern layer 63 and insulating layer 64 of the substrate 60, and the end portion of the heat conduction portion 40 is in contact with the surface of the heat spreader 65, which is exposed in the opening portion concerned and becomes the first main substrate surface 61. Other configurations are similar to those of the first embodiment shown in FIG. 1.

In the power module shown in FIG. 4 and FIG. 5, the heat, which is generated in the semiconductor devices (switching device 10 and commutation diode 20) included in the power module and propagates through the metal pattern layer 63 and the insulating layer 64 to the heat spreader 65, is also transmitted from the heat spreader 65 through the heat conduction portion 40 to the upper cooling portion 50. In other words, the heat generated in the switching device 10 and the commutation diode 20 is radiated not only from the back surface (second main substrate surface 62) of the heat spreader 65 but also from the upper surface 51 of the upper cooling portion 50.

In the power module according to the second embodiment of the present invention, the heat can be efficiently radiated from both of the upper surface and lower surface of the power module, and accordingly, the cooling capability is enhanced. As a result, in accordance with the power module shown in FIG. 4, the large cooling mechanism is not required, and the power module capable of the miniaturization can be provided. Others are substantially similar to those of the first embodiment, and a duplicate description is omitted.

Third Embodiment

Figure 6:
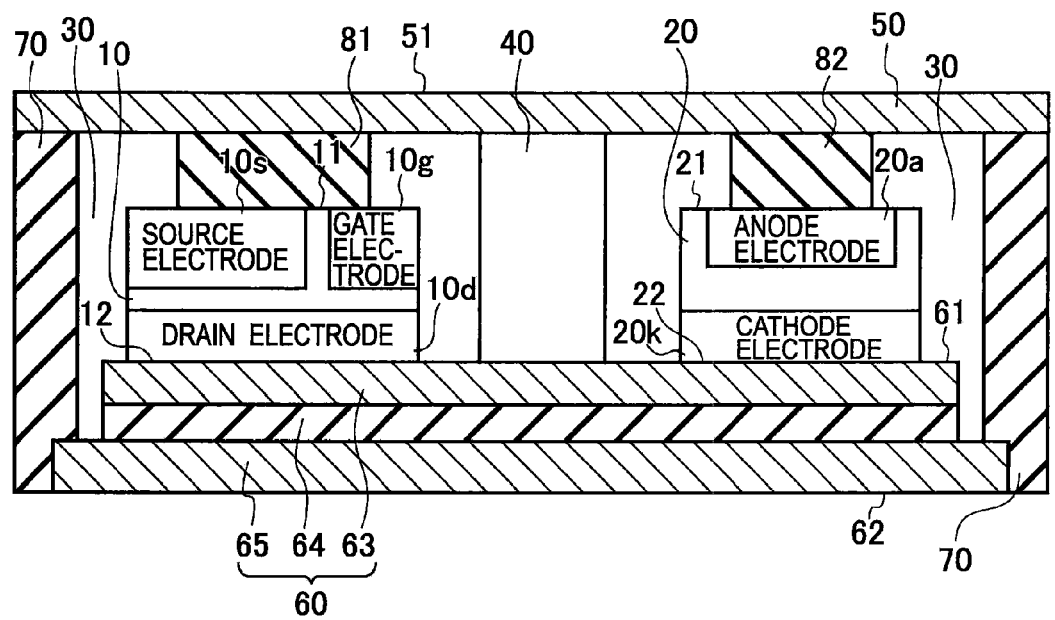
FIG. 6 is a schematic side view of a power module according to a third embodiment of the present invention.

A power module according to a third embodiment of the present invention is different from the power module shown in FIG. 1 in that, as shown in FIG. 6, there are further provided: an upper joining portion 81, which is disposed on the first main surface 11 of the switching device 10 and is brought into contact with the upper cooling portion 50; and an upper joining portion 82, which is disposed on the first main surface 21 of the commutation diode 20, and is brought into contact with the upper cooling portion 50. Other configurations are substantially similar to those of the first embodiment shown in FIG. 1.

Figure 7:
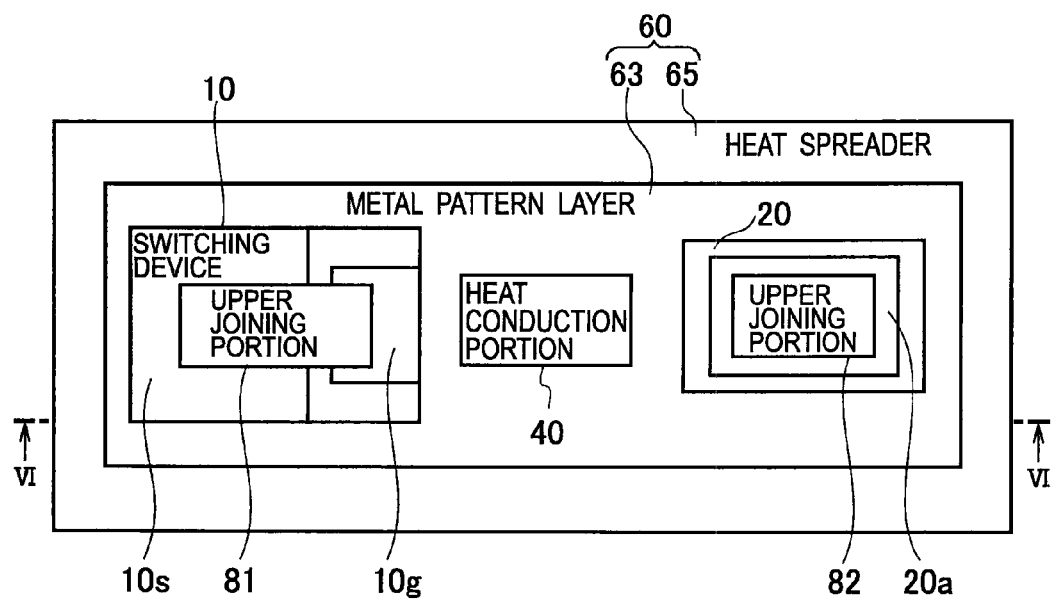
FIG. 7 is a schematic plan view of the power module according to the third embodiment of the present invention.

FIG. 7 shows a plan view of the power module shown in FIG. 6. While seeing through the upper cooling portion 50, FIG. 7 shows the substrate 60, the switching device 10, the commutation diode 20, the heat conduction portion 40, and the upper joining portions 81 and 82. As shown in FIG. 7, the upper joining portion 81 is disposed on the first main surface 11 of the switching device 10 so that upper surfaces of the source electrode 10s and the gate electrode 10 g can be partially exposed. In a similar way, the upper joining portion 82 is disposed on the first main surface 21 of the commutation diode 20 so that an upper surface of the anode electrode 20a can be partially exposed. The bonding wires are connected to a region of the first main surface 11, which is not covered with the upper joining portion 81, and to a region of the first main surface 21, which is not covered with the upper joining portion 82, and so on, whereby the source electrode 10s, the gate electrode 10 g and the anode electrode 20a can be connected to the metal pattern formed on the metal pattern layer 63 or to the wiring pattern, in the case 70.

The upper joining portions 81 and 82 are highly thermal-conductive insulating joining members, and for example, an epoxy adhesive and the like are employable therefor. Specifically, there are employable an epoxy adhesive (grease) in which the insulating ceramics are contained as a main component, the maximum operating temperature is approximately 260° C. and the thermal conductivity is approximately 4 to 5 W/mK, and the like. Alternatively, each of the upper joining portions 81 and 82 may be composed by stacking the highly thermal-conductive insulating plate and a metal plate on each other. In the case where the upper cooling portion 50 is a metal plate made of Al, Cu and the like, it is necessary that the upper joining portions 81 and 82 include insulating portions so that the respective electrodes of the switching device 10 and the commutation diode 20 cannot be short-circuited through the upper cooling portion 50 and the upper joining portions 81 and 82.

In a similar way to the power module shown in FIG. 4, the heat conduction portion 40 of the power module shown in FIG. 6 may be in contact with the heat spreader 65 of the substrate 60.

In the power module according to the third embodiment of the present invention, the heat propagates from the upper surfaces of the switching device 10 and the commutation diode 20 to the upper cooling portion 50. As shown in FIG. 6, the upper surfaces (first main surfaces 11 and 21) of the devices (switching device 10 and commutation diode 20) included in the power module are not in contact with the metal pattern layer 63 or the insulating layer 64 unlike the lower surfaces (second main surfaces 12 and 22) of the devices concerned. Therefore, it is more efficient to radiate the heat from the upper surfaces of the devices than to radiate the heat from the lower surfaces of the devices. Others are substantially similar to those of the first embodiment, and a duplicate description is omitted.

Other Embodiments

In the description of the first to third embodiments already mentioned, the example where the inverter is the three-phase PWM inverter has been shown; however, the inverter may be a power module that outputs two-phase or four-phase or more alternating currents. Moreover, the example where the power module includes the switching device 10 and the commutation diode 20 has been shown; however, it is a matter of course that the power module may include other devices.

Various modifications will become possible for those skilled in the art after receiving the teachings of the present disclosure without departing from the scope thereof.

What is claimed is:

1. A power module comprising:
   a substrate having a first main substrate surface and a second main substrate surface opposite the first main substrate surface;
   a semiconductor device disposed on the first main substrate surface, and having a first main surface on which a first main electrode is formed, and a second main surface on which a second main electrode in contact with the first main substrate surface is formed, the second main surface being opposite the first main surface;
   a heat conduction portion disposed on the first main substrate surface in a residual region of a region on which the semiconductor device is disposed, the heat conduction portion having anisotropic thermal conductive properties, in which thermal conductivity in a normal line direction of the first main substrate surface is greater than thermal conductivities in directions different from the normal line direction; and
   an upper cooling portion disposed on the heat conduction portion.

2. The power module of claim 1, wherein the semiconductor device is a switching device, in which the first main electrode is arranged to serve as a source electrode, and the second main electrode is arranged to serve as a drain electrode.

3. The power module of claim 2, wherein the semiconductor device is an insulating gate bipolar transistor.

4. The power module of claim 2, wherein the semiconductor device is made of one of silicon carbide or gallium nitride.

5. The power module of claim 1, wherein the substrate includes an aluminum nitride layer, and the semiconductor device is made of aluminum nitride.

6. The power module of claim 1, wherein the upper cooling portion is a metal plate.

7. The power module of claim 1, wherein the heat conduction portion is a composite material formed by complexing carbon fiber or special carbon fiber with highly thermal conductive metal.

8. The power module of claim 7, wherein the highly thermal conductive metal is aluminum.

9. The power module of claim 1, wherein the heat conduction portion is an insulating adhesive.

10. The power module of claim 1, further comprising a sealing film that covers a periphery of the semiconductor device.

11. The power module of claim 1, wherein the substrate includes a heat spreader, and the heat conduction portion is in contact with the heat spreader.

12. The power module of claim 11, wherein the substrate has a structure in which a metal pattern layer, an insulating layer and the heat spreader are stacked on one another, and an end portion of the heat conduction portion is in contact with a surface of the heat spreader, the surface being exposed in an opening portion provided in the metal pattern layer and the insulating layer.

13. The power module of claim 1, further comprising an upper joining portion that is disposed on the first main surface of the semiconductor device and is in contact with the upper cooling portion.

14. The power module of claim 13, wherein the upper joining portion is an insulating adhesive.

15. The power module of claim 13, wherein the upper joining portion has a structure in which an insulating film and a metal film are stacked on each other.

16. A power module comprising:
a substrate having a first main substrate surface and a second main substrate surface opposite the first main substrate surface;
a semiconductor device disposed on the first main substrate surface, and having a first main surface on which a first main electrode is disposed, and a second main surface on which a second main electrode in contact with the first main substrate surface is disposed, the second main surface being opposite the first main surface;
a heat conduction portion disposed on the first main substrate surface in a residual region of a region on which the semiconductor device is disposed; and
an upper cooling portion disposed on the heat conduction portion,
wherein the substrate comprises a structure in which a metal pattern layer, an insulating layer and a heat spreader are stacked on one another, and an end portion of the heat conduction portion is in contact with a surface of the heat spreader, the surface being exposed in an opening portion in the metal pattern layer and the insulating layer.

17. The power module of claim 16, wherein the semiconductor device is a switching device, in which the first main electrode is arranged to serve as a source electrode, and the second main electrode is arranged to serve as a drain electrode.

18. The power module of claim 17, wherein the semiconductor device is an insulating gate bipolar transistor.

19. The power module of claim 17, wherein the semiconductor device is made of silicon carbide or gallium nitride.

20. The power module of claim 16, wherein the substrate includes an aluminum nitride layer, and the semiconductor device is made of aluminum nitride.

21. The power module of claim 16, wherein the upper cooling portion is a metal plate.

22. The power module of claim 16, wherein the heat conduction portion has anisotropic thermal conductive properties, in which thermal conductivity in a normal line direction of the first man substrate surface is greater than thermal conductivities in directions different from the normal line direction.

23. The power module of claim 22, wherein the heat conduction portion is a composite material formed by complexing carbon fiber or special carbon fiber with highly thermal conductive metal.

24. The power module of claim 23, wherein the highly thermal conductive metal is aluminum.

25. The power module of claim 16, wherein the heat conduction portion is an insulating adhesive.

26. The power module of claim 16, further comprising a sealing film that covers a periphery of the semiconductor device.

27. The power module of claim 16, further comprising an upper joining portion that is disposed on the first main surface of the semiconductor device and is in contact with the upper cooling portion.

28. The power module of claim 27, wherein the upper joining portion is an insulating adhesive.

29. The power module of claim 27, wherein the upper joining portion has a structure in which an insulating film and a metal film are stacked on each other.

* * * * *